United States Patent [19]

Hewig et al.

[11] Patent Number: 4,707,561

[45] Date of Patent: Nov. 17, 1987

[54] PHOTOVOLTAIC CELL AND METHOD FOR ITS FABRICATION

[75] Inventors: Gert Hewig, Alzenau; Bernd Schurich, Bruchkoebel; Jörg Wörner, Grosskrotzenburg; Hans-Werner Schock, Stuttgart, all of Fed. Rep. of Germany

[73] Assignee: Nukem GmbH, Hanau, Fed. Rep. of Germany

[21] Appl. No.: 894,713

[22] Filed: Aug. 8, 1986

Related U.S. Application Data

[63] Continuation of Ser. No. 638,520, Aug. 7, 1984, abandoned.

[30] Foreign Application Priority Data

Aug. 10, 1983 [DE] Fed. Rep. of Germany ....... 3328869

[51] Int. Cl.$^4$ .................... H01L 31/06; H01L 31/18
[52] U.S. Cl. .................... 136/256; 136/260; 427/74; 357/30; 357/68; 357/71; 437/2
[58] Field of Search .................. 136/256, 260; 29/572, 29/588, 591; 427/74, 88, 89; 357/30, 68, 71

[56] References Cited

U.S. PATENT DOCUMENTS

| | | | |
|---|---|---|---|
| 3,990,914 | 11/1976 | Weinstein et al. | 136/246 |
| 4,036,645 | 7/1977 | Pinder et al. | 136/260 |
| 4,262,161 | 4/1981 | Carey | 136/256 |
| 4,359,487 | 11/1982 | Schneider | 427/75 |
| 4,400,244 | 8/1983 | Kroger et al. | 204/2.1 |
| 4,479,027 | 10/1984 | Todorof | 136/249 |

Primary Examiner—Aaron Weisstuch
Attorney, Agent, or Firm—Cushman, Darby & Cushman

[57] ABSTRACT

In order to provide an uncomplicated and economical front surface contact for photovoltaic cells (10) with good current discharge capability and high radiation permeability, the front surface contact (20) is composed of several layer (22, 24, 26) which are essentially unaligned with respect each other. The layers (22, 24, 26) are composed of different materials, which guarantes good ohmic coupling to the light incident semiconductor layer, good collection of free charge carriers in the semiconductor layer, and good discharge of same to a load device.

21 Claims, 3 Drawing Figures

PHOTOVOLTAIC CELL AND METHOD FOR ITS FABRICATION

This is a continuation of application Ser. No. 638,520, filed Aug. 7, 1984, which was abandoned upon the filing hereof.

BACKGROUND OF THE INVENTION

The invention relates to a photovoltaic cell, a especially to thin film solar cells, each of which comprises a first electric contact preferably mounted on a carrier on which a first (rear) and a second (front) semiconductor layer of opposite conductivity type are arranged, a second (front side) electric contact connected to the second semiconductor layer, and a cover glass covering the cell, as well as to a method for the fabrication of such photovoltaic cells.

Photovoltaic cells, also known as solar cells, include a diodelike structure and can be composed of crystalline or amorphous substances. For example, reference is made to U.S. Pat. No. 4,064,521 or the German laid open application No. 27 32 933, in which thin film solar cells are described as being made of amorphous silicon or cadmium sulphide-cuprous sulphide. Thin film solar cells can consist of a substrate on the rear surface of which a metallic contact is applied, on which again at least one p-conducting or n-conducting thin layer on which an n-conducting or p-conducting second layer is applied. Then the uppermost layer is provided with an electrically contact which can be a metal grid or a transparent conductive coating. Thereafter the solar cells of the above construction can be encapsulated. This can be effected in such a manner that the conductors or semiconductors to be encapsulated by the substrate carrier as well as a cover glass, are hot-sealed and pressed (see for example German laid open Application No. 27 32 933).

In order to obtain a high degree of efficiency of a solar cell, among other requirements, it is necessary that the front surface electric contact facing the light source provides a high radiation transmission, thus keeping the shading losses to the solar cell as little as possible. Here it is known to produce a metallic grid mounted on a support of glass and to press it on to the solar cell by means of a hot-sealing adhesive, or to make the grid by vapor deposition of a metal at high vacuum through an appropriate mask. Fine line grids with a web spacing in the range of 1 mm are used for solar cells if the front surface semconductor layer has a sheet resistance in the range of $K\Omega$, as it is typical e.g. for the $Cu_2S/CdS$ thin film solar cells. Further, when using a single contact component, the grids must have a minimum thickness in order to guarantee current conduction to the desired extent. Consequently in order to have low production and material costs, reduced radiation transmissibility must be tolerated.

Likewise, the contacts cannot be fired since manufacturing temperatures of $<400°$ C. should be used. Therefore screen-printed firable compositions as they are required to be used with Si-solar cells cannot be considered. Even with a-Si-solar cells manufacturing temperatures of $<400°$ C. must be maintained as otherwise the hydrogen will diffuse out.

OBJECTS OF THE INVENTION

It is therefore an object of the present invention to develop photovoltaic cells of the initially mentioned kind in such a manner that the contact on the front surface can be made simply and at low cost, where at the same time, due to good current conduction the radiation transmission shall be improved, thus minimizing the shading of the active layers by the second electric contact.

According to the invention this problem is solved in that the front surface contact is composed of several layers, which in top view are not arranged in alignment with each other. The layers are made of different materials, guaranteeing good ohmic contact to the second semiconductor layer, good collection of free charge carriers in the second semiconductor layer, as well as good conduction of same to e.g. a load device or to conductor lines for the interconnection of several solar cells. Therefore the front surface contact is made of three layers arranged one on top of the other, which layers are composed of a contact connector-layer forming an ohmic connection to the second semiconductor layer, a current collection layer which collects charge carriers from the second semiconductor layer, and a current bus-layer forming a connection to e.g. a conductor line for the interconnection of several solar cells or to a load device.

These layers, especially the current colletor-layer and the current bus-layer, each can be arranged separately in strips or lines, respectively, which however in top view should form a grid structure. Thereby the width of the lines as compared to grid contacts of uniform material can be chosen smaller so that the shading loss of the active material of the solar cell will be less.

In order that the current collecting and current bus-layers, which in top view preferably are in the shape of a grid structure, are well adhered, according to an embodiment of the invention they can be imbedded, at least partially, in a transparent adhesive layer or cemented by that layer. This preferably non-conducting transparent layer thereby can also be used as a mask for the application of the individual layers to establish the front surface electric contact. For example, the transparent layer can be applied by screen printing in such a manner as to result in a more or less geometrical arrangement of openings into which then the layers defining the front surface contact can be imbedded selectively e.g. by a chemical, physical, or galvanic process.

In a preferred embodiment only the current collection layer and the current bus-layer have a grid structure, whereas the contact connector-layer is applied to the entire surface of the second semiconductor layer or only under the areas of the current collecting layer. The contact connector-layer can be applied to the grid also as a conducting adhesive in order to firmly connect the current collection layer and the current bus-layer with the semiconductor by that means. A contact connector-layer covering the entire surface must of course be transparent, and can be made by sputtering, deposition from chemical solutions, or by printing of ITO, SnOx, or organic conductors such as e.g. polyphenyl acetylene, polyphenylene, polythiopene, polypyrrole, polyphenylene sulphides, and tetrathiofulvalene tetracyanoquinidomethane.

In order to eliminate any damage to the front surface electrically conducting contact by e.g. mechanical stresses due to varying temperatures, in one embodiment a mechanically decoupling takes place between the cover glass and the front surface electric contact by means of a second transparent layer of non-conducting material made of synthetic material (polymer layer).

For this purpose a material like silicone rubber or polyvinylbutyral with appropriate softeners such as epoxies is especially suitable. Thereafter on this decoupling layer, the cover glass having an adhesive means on its rear surface is placed, which cover glass eventually can be replaced by a plastic layer, in order to subsequently encapsulate the cell. The adhesive layer and the decoupling layer can be made of the same material.

Preferred materials for the contact connector-layer, in addition to the ITO, SnOx, or organic conductors deposited over the entire area, include selectively deposited gold, palladium or carbon pastes, or carbon adhesives.

The current collecting-layer is preferably made of silver conducting paste. The current bus-layer is preferably made of copper or silver conducting paste.

Of course, according to still another embodiment, the current collecting layer and the current bus-layer can be constructed as a unit and be web-shaped.

The method for the fabrication of photovoltaic cells of the above described kind substantially includes the following method steps:
(a) Deposition of a first electrically conducting contact on a carrier,
(b) Deposition of a first and subsequently a second (front surface) semiconductor layer of different type of conductivty on the first electric conducting contact,
(c) Deposition of a second (front surface) electrically conducting contact on the second semiconductor layer,
(d) Covering the second electric conducting contact with a cover glass,
(e) Encapsulation of the photovoltaic cell
and excels especially by the fact that
(f) the deposition of the second electrically conducting contact is accomplished by successively applying different electrically conducting layers, which in top view are arranged substantially unaligned to each other,
(g) a decoupling layer is deposited on the second electrically conducting contact, which mechanically decouples the cover glass to that contact.

In addition, at least one of the upper layers of the second contact facing the light source can be fixed in place by an encapsulating layer. The encapsulating and decoupling layers, of course, must be transparent. The same applies in the case where the contact connector-layer is deposited directly on the second semiconductor layer and covers the whole area.

In one embodiment, the encapsulating layer, preferably having been applied by a screen-printing process, is configured as a masking layer having free spaces in which at least some of the layers defining the front contact can be inserted.

The encapsulating layer, in which the second electrically conducting contact is at least partially embedded for mechanical positioning, can be an activatable adhesive such as e.g. epoxy, which is cured by e.g. temperature, pressure, ultra-violet rays, or IR rays.

The encapsulating layer and the decoupling layer can also be made of the same base material such as e.g. polyvinylbutyral, if, for example, more softeners such as epoxies are added to the decoupling layer than to the fixing layer.

In a preferred manner, the contact connector-layer of carbon pastes or carbon adhesives is applied selectively by e.g. printing by means of a screen or a swab, where the layer subsequently is thermally treated at a temperature T with T <200° C., preferably 140° <T<160° C.

The use of soot/graphite pastes for the contact connector-layer, as compared e.g. to the galvanically applied layers, offers the substantial advantage that eventual pin-holes in the second semiconductor layer are not necessarily be filled up. Thereby the risk of formation of low-resistance shunts is reduced.

The invention offers the choice of selecting a rather small area extent for the layers forming the front surface contact as compared to the total surface area of the semiconductor layer, thus resulting in a small shading only, which is manifested in an increased efficiency of the solar cell. Further, by the embedding or cementing of the front surface contact and mechanical decoupling from the adjacent areas of the solar cell, it is guaranteed that as compared to known solar cells, thermal stress will cause much damage to the front surface contact, which otherwise would make the solar cell inoperative.

According to the invention, there also takes place an additive application of the layers on the locations on the second semiconductor layer where the second electric contact is required. This application process offers a significant advantage with respect to cost, as compared to the subtractive process.

BRIEF DESCRIPTION OF THE DRAWINGS

Further details, advantages and characteristics of the invention will appear from the claims and embodiment examples as shown in the drawing, where

DETAILED DESCRIPTION

Figure 1:
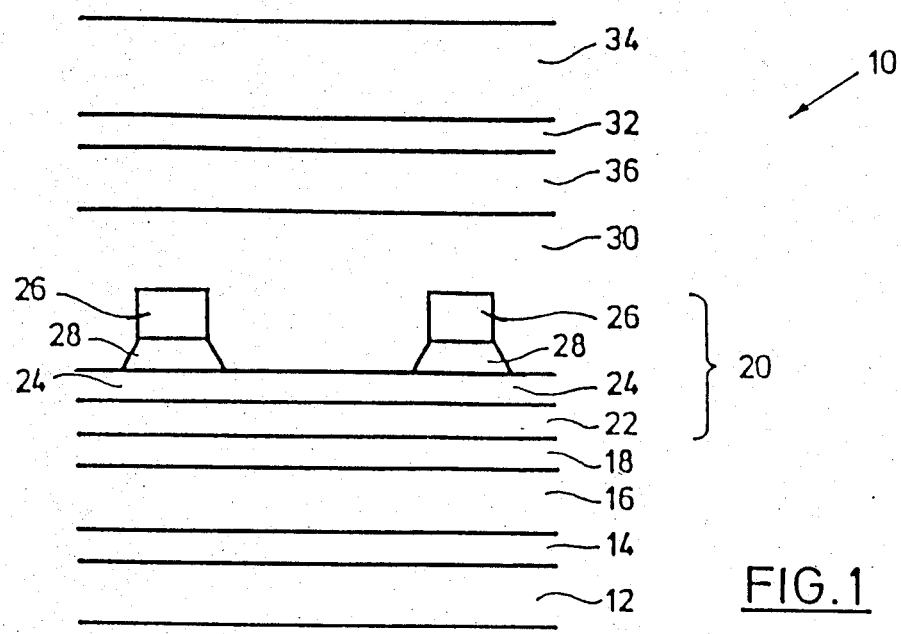
FIG. 1 is a schematic cross-sectional diagram of the construction of a photovoltaic cell according to the invention (not to scale)

In FIG. 1 the basic construction of a solar cell 10 is shown, by means of which the essential characteristics of the invention shall be explained. On a base plate or substrate 12, preferably made of glass, a first electrically conducting contact 14 is deposited, which e.g. can be a silver layer or a single transparent layer that is deposited on the substrate glass 12 by evaporation. A layer of adhesive agent can be arranged between the substrate glass 12 and the contact 14.

In the case where the solar cell 10 is a cadmium sulphide-caprous sulphide solar cell, a layer 16 of cadmium sulphide of a thickness of approx. 30 $\mu$m is evaporated on the first electrically conducting contact 14. This first semiconductor layer 16 may be roughened by means of an aqueous hydrochloric acid treatment in order to reduce reflections and for etching out grain boundaries. Cuprous sulphide layer 18 as the second (front surface) semiconductor layer has a thickness of about 0.2 $\mu$m. According to the invention, a second electrically conducting contact 20 is now deposited on the semiconductor layer 18, which contact 20 is composed of a contact connector-layer 22, a current collecting layer 24 and a current bus-layer 26, which layers are arranged in unaligned relation—as illustrated by the sectional diagram. (In the embodiment of this example there is also provided a contact connector-layer 28 of solder, for example, between the current bus-layer 26 and the current collection layer 24).

In the embodiment of this example the contact connector-layer 22 covers the entire surface area of layer 18 but, of course, it can also be applied selectively, that is, not over the entire area. The current collection layer 24 and the current bus-layer 26 are each of strip or line form as made clear in more detail by FIGS. 2 and 3, where the stripes or lines preferably cross each other so that in top view there will be a grid-shaped second electric contact 20 since the contact connector-layer 22 is transparent.

The contact connector-layer 22, which can be 2 to 3 $\mu$m thick, in the case of a complete coverage configuration, can be applied e.g. by sputtering, deposition from a chemical solution, or printing of ITO, SnOx, or organic conductors such as e.g. polyphenyl acetylene, polyphenylene, polythiopene, polypyrrole, polyphenyl sulphide, and tetrathiofulvalene tetracyanoquinidomethane. Alternatively, the contact connector-layer 22 can be applied selectively by screen or swab printing of gold, palladium, or carbon pastes or carbon adhesives on the second semiconductor layer 18. A continuous masking layer with openings can likewise be applied on the second semiconductor layer 18, and then the contact connector material is deposited in the existing free spaces. The masking layer itself can form the contact connector-layer. In the event, however, that a contact connector-layer shall be applied separately, a suitable material for this purpose would likewise by gold, palladium, or carbon paste or carbon adhesive, which e.g. are deposited in a galvanic or electrophoretic process. The contact connector-layer 22—notwithstanding its geometry—forms a good ohmic contact to the second semiconductor layer 18.

Thereafter the current collection layer 24 is deposited on the contact connector-layer 22, said current collection layer being preferably composed of stripes or lines running parallel to each other. The width of the stripes can be 30 to 150 $\mu$m with a height of approx. 10 to 35 $\mu$m. The current collection layer 24 can be deposited on the contact connector-layer 22 by the printing of pastes or by known galvanic, chemical, or physical methods. Especially suitable materials for the current collecting layer 24 are nickel, copper, solder such as e.g. indium, nickel being used if the contact connector-layer 22 is made of gold in order to prevent permeation of Au.

The current collection layer 24 is followed by the current bus-layer 26—via intermediate contact connector-layer 28 e.g. of a paste—so that charge carriers collected by the current collecting-layer 24 can be transported via layer 26 to e.g. a conductor line (not shown) provided for the interconnection of several solar cells, or to a load device.

The current bus-layer 26, which likewise can have a height of 10 $\mu$m to 35 $\mu$m, is preferably composed of stripes of a width of 100 to 500 $\mu$m running parallel or almost parallel to each other. The current bus-layer 26, preferably being of copper, can be deposited galvanically or electrophoretically. Further, the stripes of the current bus-layer 26 are oriented in a different manner than those of the current collection layer 24. Preferably a grid-like structure should appear in top view.

The front surface contact 20, essentially composed of the contact connector-layer 22, the current collecting-layer 24, and the current bus-layer 26, is followed by another layer 30, serving to encapsulate the second electric conducting contact 20. In the embodiment example the encapsulating layer 30, being made of transparent material and preferably not conductive, is deposited on the electric contact 20. However, since the electric contact 20 consists of stripe-like layers, it is preferably to imbed the same in the layer 30. The encapsulating layer 30 can consist of polymers which can be hardened chemically or physically, e.g. by ultraviolet radiation, temperature, or pressure, and is preferably applied by a screen printing process.

Thereafter, if necessary, a cover glass 34 provided with an adhesive agent 32 can be mounted on the encapsulating layer 30 in order to form the finished solar cell 10. However, in order to guarantee that thermal or mechanical stress will not cause any damage to the front surface contact 20, according to the inventive embodiment, a mechanical decoupling occurs between the cover glass 34 and the grid-like contact 20 partially embedded by the layer 30 by the provision of an additional layer 36, preferably made of synthetic material such as silicone rubber or polyvinylbutyral, which can be applied by printing or casting method. This decoupling layer 36 serves especially to absorb expansion differences between the front surface contact 20 and the adjacent layers so that mechanical destruction cannot take place.

The above described construction system of the solar cell 10 can also be used for tandem systems, where the substrate of the second cell placed on the cover glass 34 can be a foil and where the first electrically conducting contact is transparent, in order to arrange thereon a solar cell of the above described construction.

Figures 2, 3:
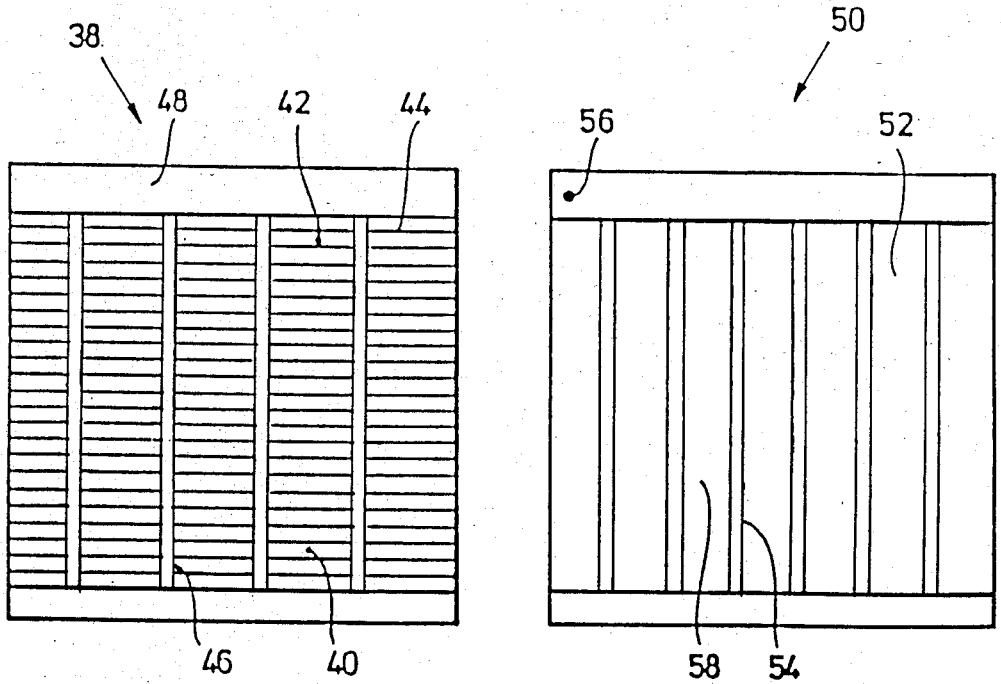
FIG. 2 shows a first type of embodiment of a solar cell in top view and FIG. 3 a second type of embodiment of a solar cell in top view.

FIG. 2 shows in top view a solar cell 38, showing clearly the grid-like structure of front surface contact 40. The front surface contact 40 is substantially composed of three layers 42, 44, and 46. The layer 42 is transparent, covers the whole surface, and constitutes the contact connector-layer. On this contact connector-layer the current collection layer 44 in the form of lines arranged at a distance to each other and essentially running in parallel is applied by e.g. screen printing, galvanic, chemical, or physical processes. The individual stripes or lines have a width of 30 to 150 $\mu$m, and a spacing between lines of preferably 700 $\mu$m to 1000 $\mu$m. Thereafter the current bus-layer 46 likewise of strip-like configuration, which can be made of copper bands, is deposited on the current collection layer 44. The width of these copper bands 46 can be 100 to 500 $\mu$m, while the distance between the individual lines is preferably 1 to 10 mm. The copper lines 46 can then be connected with a conductor line 48 as indicated at the edge of the solar cell 38, which on its part is connected to conductor lines of further solar cells or to a load device. In other respects the construction of the solar cell is substantially the same as described in FIG. 1, i.e. the current collection layer 44 and the current bus-layer 46 are fixed in position by a transparent layer and are protected by a decoupling layer arranged below the cover glass.

The solar cell 50 shown in top view in FIG. 3 does not have any grid structure for its front surface electrically conducting contact 52. The reason for this is that the current collection layer and the current bus-layer are designed as a composite of lines 54 preferably running in parallel to each other, which on their part end at a conductor path 56. The lines or webs 54 of a solar cell e.g. of size 10×10 cm$^2$ have a spacing of 700 $\mu$m to 1000 $\mu$m, where the cross section of each individual line is about 35×100 cm$^2$. The contact connector-layer 58 covers the entire front surface.

Concerning the specific resistivities of the individual layers, it should be noted that these are within the magnitude for $\phi$ contact connector-layer $\leq 1$ ohm cm,
$\phi$ current collection layer $\leq 10^{-2}$ ohm cm, and
$\phi$ current bus-layer $\leq 10^{-4}$ ohm cm.

If the current bus-layer and the current collection layers—as shown in FIG. 3—are designed as a composite composed of stripes or lines, then $\phi$ is $\phi \leq 10^{-4}$ ohm cm.

On account of the teachings according to the invention, namely to construct the front surface contact of a solar cell by means of layers essentially not in alignment with each other which in top view together preferably display a grid structure or parallel or substantially parallel ribs, the advantage is offered that the total surface of the electric contact as compared to contacts of uniform material over the active surface of the solar cell, can be of smaller dimensions so that there will be less shading and thus a higher efficiency without any losses as far as the current transport is concerned. Consequently the front contact can be called transparent.

We claim:

1. A photovoltaic cell comprising:
    a substrate;
    a first electrical contact deposited on the substrate;
    a first semiconductor layer deposited on said first electrical contact and a second semiconductor layer, of opposite type of conductivity to that of said first semiconductor layer, deposited on said first layer;
    a second electrical contact connected to the second semiconductor layer, said second electrical contact including three layers, composed of different materials, said three layers including (a) a current collecting layer made of a first material and having a grid-like structure, having a specific resistivity equal to or less than $10^{-2}$ for collecting charges from the second semiconductor layer, (b) a current bus layer made of a second material and having a grid-like structure in unaligned overlying contact with the current collecting layer and having a specific resistivity equal to or less than $10^{-4}$ ohm cm, and (c) a contact connecting layer, made of a third material and having a specific resistivity equal to or less than 1 ohm cm, forming an ohmic contact to the second semiconductor layer and disposed between the second semiconductor layer and the current collecting layer; and
    an optically transparent element covering the cell.

2. Cell according to claim 1 further including an encapsulating layer, wherein the current collecting layer and the current bus layer are embedded at least partly in said encapsulating layer.

3. Cell according to claim 2 wherein said encapsulating layer is used as a mask for the application of the layers constituting the second electrical contact.

4. Cell according to claim 1 wherein the contact connector layer is deposited over the entire surface of the second semiconductor layer and the current collecting layer and the current bus layer are deposited on the contact connecting layer selectively as a unit.

5. Cell according to claim 4 wherein the contact connector layer is deposited over the entire surface of the second semiconductor layer by sputtering, by deposition from chemical solution or by printing of at least one organic conductor.

6. Cell according to claim 5 wherein the organic conductor is a polyphenylacetylene.

7. Cell according to claim 1 wherein the second electrical contact is mechanically uncoupled from said covering element.

8. Cell according to claim 7 wherein the second electrical contact is contained in an encapsulating layer on which an uncoupling layer is applied effecting the mechanical uncoupling, and wherein the encapsulating layer and the uncoupling layer consist of the same basic material with different proportions of softeners.

9. Cell according to claim 1 wherein the contact connector layer is deposited selectively.

10. Cell according to claim 9, wherein the contact connector layer is deposited by printing with a screen or swab and comprises gold or palladium.

11. Cell according to claim 1 wherein the contact connector layer includes a carbon based adhesive or paste, wherein the ohmic contact and the conductivity of the layer are provided by means of graphite and soot particles.

12. Cell according to claim 1 wherein the current collecting layer comprises a silver conducting paste and the current bus layer comprises copper or silver conducting paste.

13. Process for the manufacture of photovoltaic cells comprising the steps of:
    a. depositing a first electrically conducting contact on a substrate;
    b. depositing a first semiconductor layer on said first electrically conducting contact, depositing a second semiconductor layer of opposite type of conductivity on the first semiconductor layer,
    c. depositing a second, electrically conducting contact comprises at least in part of intersecting grids of different materials on the second semiconductor layer, and
    d. covering the second electrically conducting contact with a covering element
    wherein
    e. the deposition of the second electrically conducting contact occurs by the successive deposition of intersecting grids of different electrically conducting layers which are essentially arranged unaligned to each other, and
    f. a layer is deposited on the second electrically conducting contact which mechanically uncouples the covering element from said second electrical contact.

14. Method according to claim 13 wherein a contact connecting layer in ohmic contact with said second semiconductor layer and having free spaces is applied as part of said second, electrically conducting contact and an encapsulation layer forming a mask is applied in the free spaces of the contact connecting layer before further layers are deposited.

15. Method according to claim 14 wherein a contact connector layer is applied over the entire surface of the second semiconductor layer, and where an encapsulating layer for the second electrically conducting contact is selectively deposited directly after the contact connector layer has been deposited.

16. Method according to claim 13 wherein the encapsulating layer applied is formed as a masking layer with free spaces, and in these free spaces at least some of the layers forming the second electrically conducting contact are subsequently embedded.

17. Method according to claim 16 wherein the encapsulating layer deposited on the second semiconductor layer forming a mask is an activatable adhesive and is cured by the influence of temperature, pressure, UV rays or IR rays.

18. Method according to claim 17 wherein the encapsulating layer forming the mask is deposited on the second semiconductor layer before the contact connector layer is deposited.

19. Method according to claim 17 wherein after the contact connector layer is deposited on the second semiconductor layer, the encapsulating layer forming the mask is deposited in the free spaces present in the contact connector layer.

20. Method according to claim 13 wherein a contact connecting layer having free spaces is applied as part of said second, electrically conducting contact and the contact connector layer consists of carbon based paste or adhesive, and is applied selectively, and where the layer is subsequently thermally treated at a temperature T with T<200°.

21. Method according to claim 20 wherein the thermal treatment occurs at a temperature T within the range 140° C.<T<160° C.

* * * * *